United States Patent
Stanishevsky et al.

(10) Patent No.: US 12,224,162 B2
(45) Date of Patent: Feb. 11, 2025

(54) CATALYTIC NANOFIBER MEMBRANE ASSEMBLY AND REDUCED PRESSURE PLASMA REACTOR FOR FLUID, VAPOR AND GAS PROCESSING

(71) Applicant: THE UAB RESEARCH FOUNDATION, Birmingham, AL (US)

(72) Inventors: Andrei V. Stanishevsky, Birmingham, AL (US); Riley Yager, Birmingham, AL (US)

(73) Assignee: THE UAB RESEARCH FOUNDATION, Birmingham, AL (US)

(*) Notice: Subject to any disclaimer, the term of this patent is extended or adjusted under 35 U.S.C. 154(b) by 0 days.

(21) Appl. No.: 18/381,411

(22) Filed: Oct. 18, 2023

(65) Prior Publication Data
US 2024/0128059 A1    Apr. 18, 2024

Related U.S. Application Data

(60) Provisional application No. 63/417,088, filed on Oct. 18, 2022.

(51) Int. Cl.
    *H01J 37/32* (2006.01)
(52) U.S. Cl.
    CPC .... *H01J 37/3255* (2013.01); *H01J 37/32541* (2013.01)

(58) Field of Classification Search
    CPC ............ H01J 37/3255; H01J 37/32541
    See application file for complete search history.

(56) References Cited

U.S. PATENT DOCUMENTS 8,471,170 B2 * 6/2013 Li ............... H01J 37/32568
                                              219/121.36
2004/0206618 A1 10/2004 Voecks

OTHER PUBLICATIONS

Li et al., WO 2009009212, Jan. 2009 (Year: 2009).*
Soliman et al., WO 2023060027, Apr. 2023 (Year: 2023).*
Wu, et al., "Coupling Nonthermal Plasma with V2Od/TiO2 Nanofiber Catalysts for Enhanced Oxidation of Ethyl Acetate", I&EC Research, Ind Eng. Chem. Res., Nov. 2018.

* cited by examiner

*Primary Examiner* — Mary Ellen Bowman
(74) *Attorney, Agent, or Firm* — Thomas | Horstemeyer, LLP

(57) ABSTRACT

Various examples are provided related to catalytic nanofiber membrane assemblies or structures which can be used in plasma reactors. In one example, a three-dimensional (3D) catalytic structure includes nanofiber-based elements (NFBEs) and electrodes placed about the NFBEs with the NFBEs stacked between the electrodes. In another example, a plasma reactor includes a vessel containing the 3D catalytic structure where gas pressure in the vessel is less than 1 atmosphere.

20 Claims, 7 Drawing Sheets

CATALYTIC NANOFIBER MEMBRANE ASSEMBLY AND REDUCED PRESSURE PLASMA REACTOR FOR FLUID, VAPOR AND GAS PROCESSING

CROSS REFERENCE TO RELATED APPLICATIONS

This application claims priority to, and the benefit of, U.S. provisional application entitled "Catalytic Nanofiber Membrane Assembly and Reduced Pressure Plasma Reactor for Fluid, Vapor and Gas Processing" having Ser. No. 63/417,088, filed Oct. 18, 2022, which is hereby incorporated by reference in its entirety.

BACKGROUND

Plasma catalytic reactors are usually based on dielectric-barrier discharge (DBD), gliding arc, jet plasma, glow, and corona discharges. Low frequency (less than 150 kHz) DBD reactors are the most frequently used because of their relative design simplicity, ability to operate at atmospheric pressure, process cleanness, low cost, and scalability.

SUMMARY

Aspects of the present disclosure are related to catalytic nanofiber membrane assemblies or structures which can be used in plasma reactors. In one aspect, among others, a three-dimensional (3D) catalytic structure comprises a plurality of nanofiber-based elements (NFBEs); and a plurality of electrodes placed about the plurality of NFBEs, the plurality of NFBEs stacked between the plurality of electrodes. In one or more aspects, the plurality of NFBEs can comprise ceramic nanofibers, carbon nanofibers, metal nanofibers, or a combination there of. The plurality of electrodes can be bare or isolated. One or more NFBE of the plurality of NFBEs can comprise a multilayer structure or a gradient structure.

In various aspects, one or more pairs of adjacent NFBEs of the plurality of NFBEs can be separated by a gap. The gap between the adjacent NFBEs can be formed by a spacer. The at least one spacer can comprise a solid glass spacer, a ceramic spacer, or a rigid NFBE-based spacer. A gap between an electrode of the plurality of electrodes and an adjacent NFBE of the plurality of NFBEs can be formed by a spacer. Individual NFBEs of the plurality of NFBEs can have a thickness of about 0.1 mm or greater. Total porosity of the plurality of NFBEs can be about 80% or greater. Nanofibers of one or more of the plurality NFBEs can be seeded with a co-catalyst. The co-catalyst can be seeded on the nanofibers in a continuous layer or particles.

In another aspect, a plasma reactor comprises a vessel containing a three-dimensional (3D) catalytic structure comprising a plurality of nanofiber-based elements (NFBEs); and a plurality of electrodes placed about the plurality of NFBEs, the plurality of NFBEs stacked between the plurality of electrodes; where gas pressure in the vessel is less than 1 atmosphere. In one or more aspects, the plurality of electrodes can be inside the vessel or outside the vessel. A DC voltage or a periodic high voltage can be applied to the plurality of electrodes. Spacing between adjacent electrodes of the plurality of electrodes can be between about 5 mm to about 200 mm. A gas or a fluid can be supplied to one or more NFBE within the 3D catalytic structure.

In various aspects, the plurality of NFBEs can comprise ceramic nanofibers, carbon nanofibers, metal nanofibers, or a combination there of. The plurality of electrodes can be bare or isolated. One or more NFBE of the plurality of NFBEs can comprise a multilayer structure or a gradient structure. One or more pairs of adjacent NFBEs of the plurality of NFBEs can be separated by a gap. The gap between the adjacent NFBEs can be formed by a spacer. The at least one spacer can comprise a solid glass spacer, a ceramic spacer, or a rigid NFBE-based spacer. A gap between an electrode of the plurality of electrodes and an adjacent NFBE of the plurality of NFBEs can be formed by a spacer. Individual NFBEs of the plurality of NFBEs can have a thickness of about 0.1 mm or greater. Total porosity of the plurality of NFBEs can be about 80% or greater. Nanofibers of one or more of the plurality NFBEs can be seeded with a co-catalyst. The co-catalyst can be seeded on the nanofibers in a continuous layer or particles.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A and 1B illustrate examples of dielectric-barrier discharge (DBD) plasma reactors, in accordance with various embodiments of the present disclosure.

DETAILED DESCRIPTION

Figure 1B:
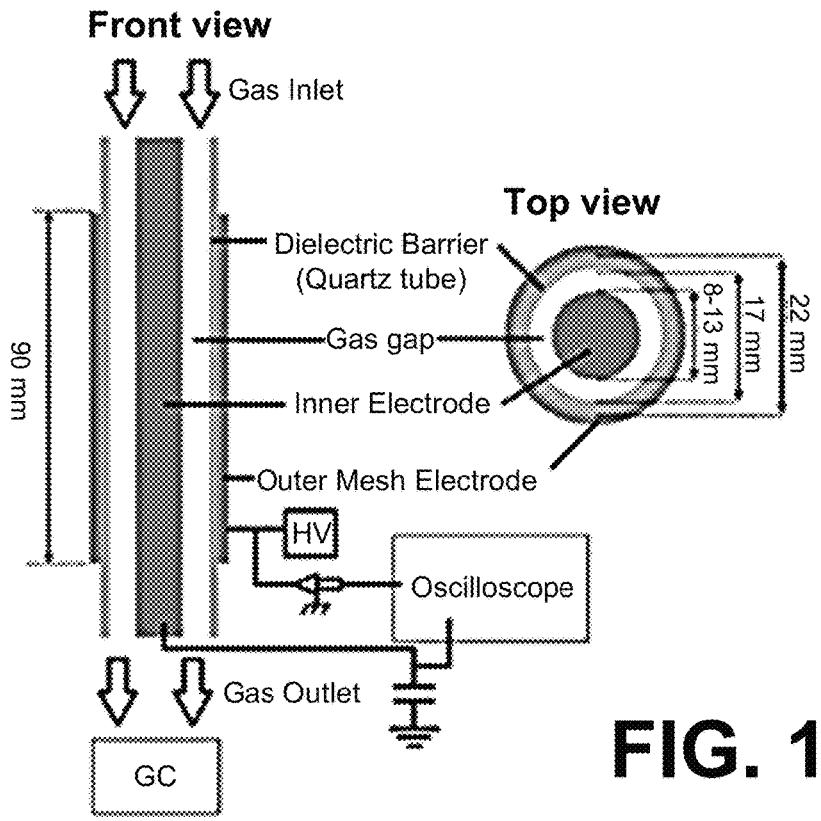
Figure 1B:
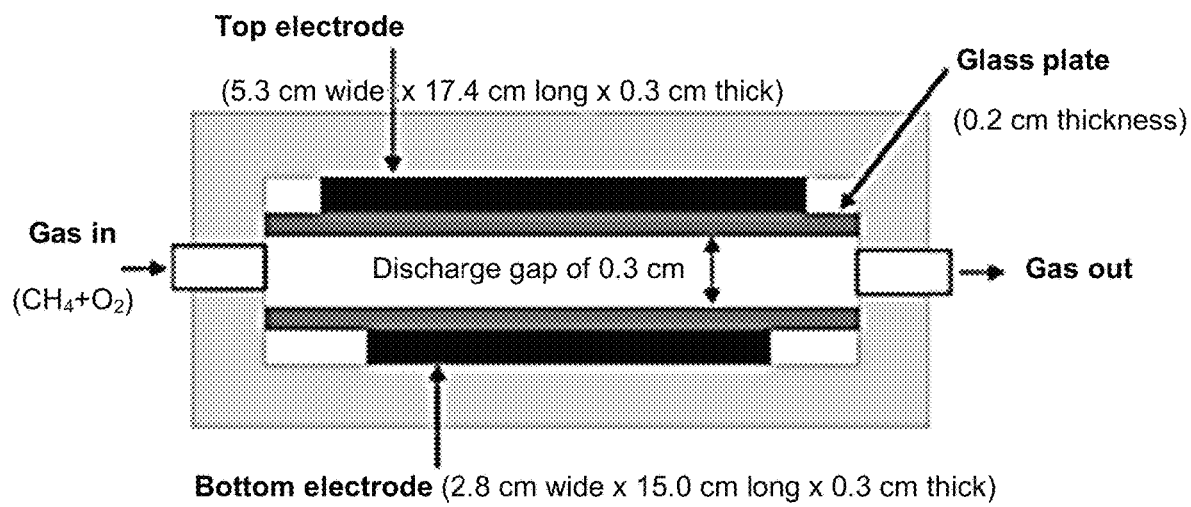

Disclosed herein are various examples related to catalytic nanofiber membrane assemblies or structures which can be used in plasma reactors. Reference will now be made in detail to the description of the embodiments as illustrated in the drawings, wherein like reference numbers indicate like parts throughout the several views.

Figure 2A:
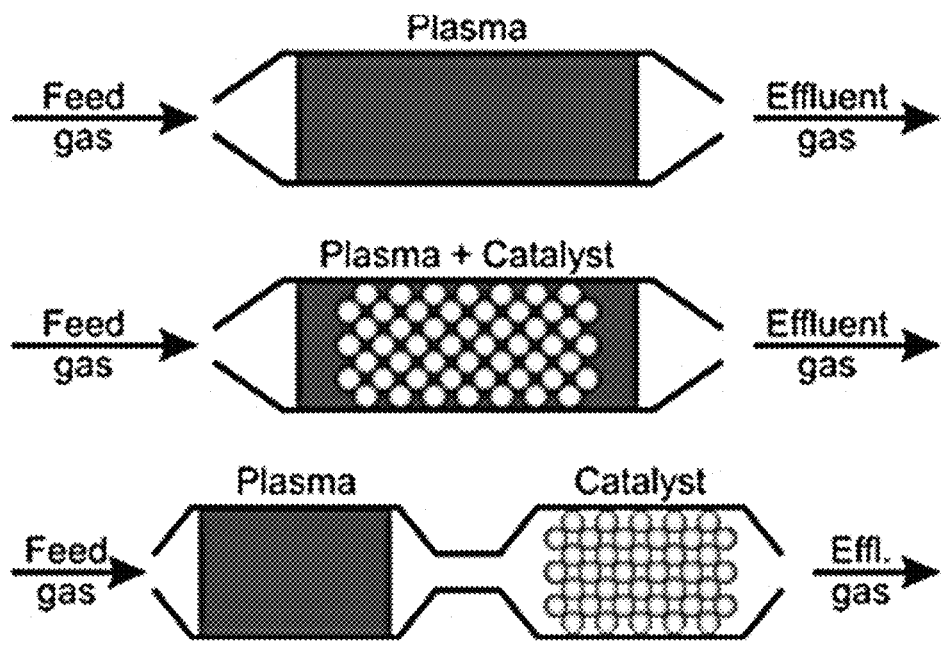
FIGS. 2A and 2B illustrate examples of catalyst placement in plasma reactors, in accordance with various embodiments of the present disclosure.
Figure 2B:
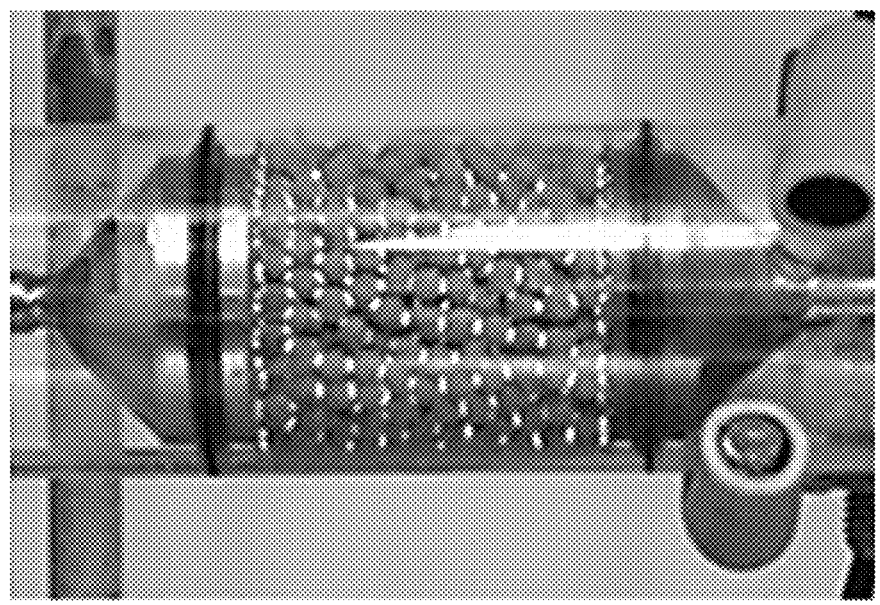

FIGS. 1A and 1B illustrate examples of dielectric-barrier discharge (DBD) plasma reactors. FIG. 1A shows a single-DBD (or SDBD) and FIG. 1B shows a double-DBD (or DDBD). Such DBD reactors can utilize either an electrically insulating (quartz, glass, ceramic or plastic) tube with an inner metal electrode and an external electrode (FIG. 1A) or a flat "dish" reactor with both electrodes outside the insulator material (FIG. 1B). A catalyst can be introduced within or after a plasma zone, as illustrated in the examples of FIG. 2A, to allow greater flexibility in plasma species/catalyst interaction, where the catalyst itself can also serve as a dielectric layer. FIG. 2B is an image showing the ceramic beads (e.g., seeded with catalyst) as a dielectric layer. So far, the main focus in plasma catalysis has been on the use of non-thermal plasma interacting directly with a catalyst at atmospheric pressure.

A catalyst system can be used, for example, in a water-gas shift reactor of a fuel processor. The catalyst system can include a foam-type catalyst support structure and a non-thermal plasma generation device for generating a non-thermal plasma in the catalyst bed in order to enhance the catalytic reaction taking place in the catalyst bed. The use of the foam catalyst support structure allows the plasma to permeate throughout the catalyst bed structure. This system operates at atmospheric pressure and a solid foam support loaded with catalyst particles is used. The plasma is produced as "streamers" (a.k.a. filamentary discharge, a type of transient electrical discharge that appears as luminous writhing branching sparks or micro arcs) that result in catalyst degradation. The system cannot operate with fluids.

Photocatalyst loaded nanofibrous polymer membrane can be incorporated between two electrodes to trap pollutants and enhance their dissociation. The nanofibrous membrane provides a high surface area network to maximize the performance of photocatalyst and functional agents, enabling the formation of bacteria-killing reactive oxygen species without releasing ozone. It is a specialized "corona" discharge system that operates in air at atmospheric pressure and is not intended for the functions of a typical plasma catalytic reactor.

A study has been conducted on $V_2O_5/TiO_2$ nanofiber catalysts loaded on quartz wool and placed in a common DBD reactor similar to that shown in FIG. 1A. The system operates at atmospheric pressure. There is direct contact between the inner electrode and the nanofibers, plasma is produced as streamers, and the system will not operate with liquids.

Figure 3:
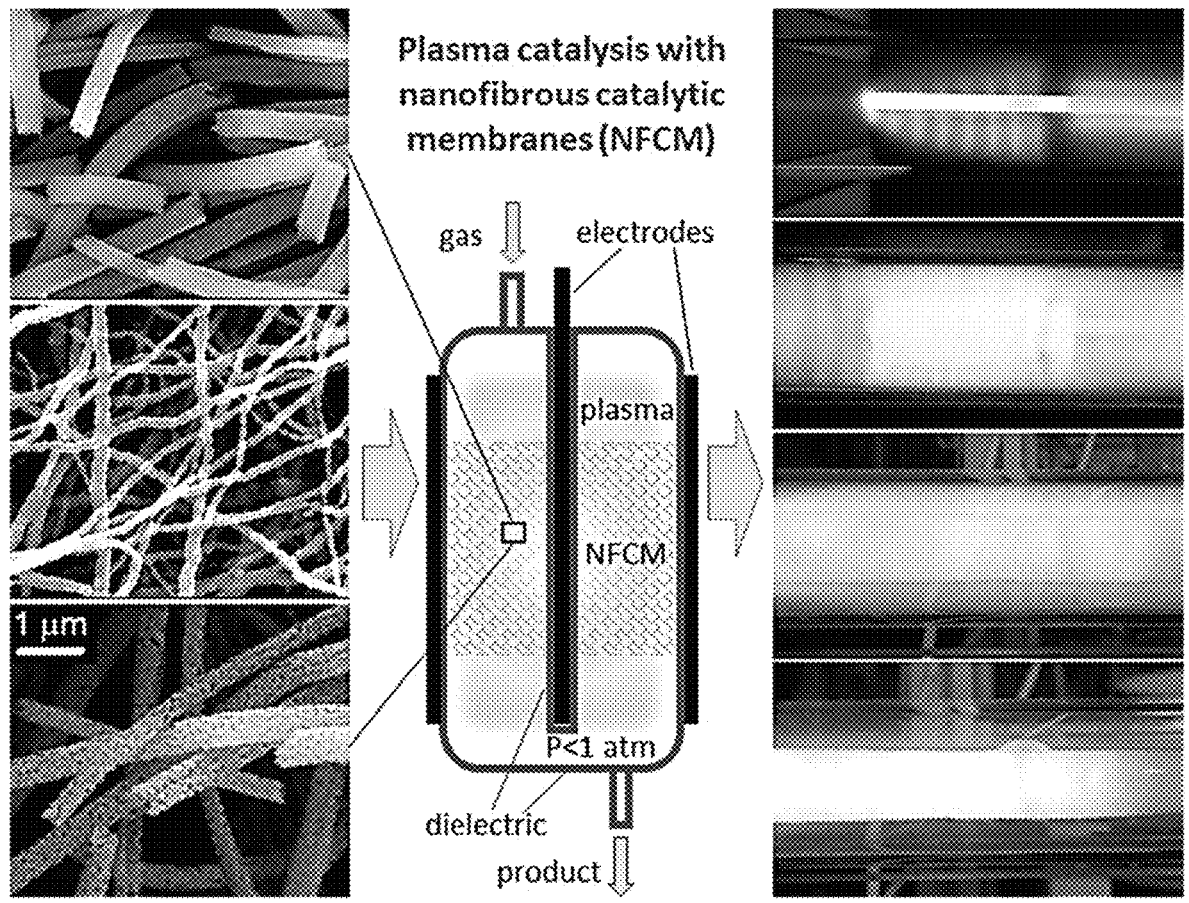
FIG. 3 illustrates an example of a nanofibrous catalytic membrane (NFCM) element, in accordance with various embodiments of the present disclosure.

A preliminary study has shown the feasibility of utilizing ceramic nanofibers to enhance the conversion of $CO_2$ at 6-8 Torr pressure (Martian conditions) by about 50% when compared to DBD plasma alone. FIG. 3 illustrates an example of a nanofibrous catalytic membrane (NFCM) element comprising fibers with tailored structure and properties and diameters less than 1000 nm. When immersed in a gas discharge plasma, the NFCM design and plasma parameters showed strong impact on plasma appearance, species present, and products obtained. Production of molecular oxygen has been observed up to 1.3 g/h at the calculated energy efficiency of up to 31.6%. The experiments were performed with loose nanofibers loaded in the DBD reactor similar to that shown in FIG. 1A and focused on plasma and product diagnostics with or without nanofibers.

The present disclosure is based on the plasma species being significantly affected not only by the presence but also by the location of a highly porous catalytic element inside the plasma. However, there is little information on how the species are affected by the catalytic component design and location even for most studied plasma processes at ambient pressures.

When compared to atmospheric plasma, the advantages of plasma catalysis at reduced pressures include the ability to achieve higher energy densities inside the catalyst, increase the plasma-surface interaction area, stimulate plasma species diffusion inside the porous catalyst, and expand the range of process gases. The low-pressure plasma catalysis can be very efficient in different reactions including, but not limited to, biogas (50-70% CH 4, 30-40% $CO_2$) conversion, $CO_2$ splitting, and hydrogenation. A properly designed and positioned catalytic structure combined with reduced pressure can prevent the streamer formation and catalyst degradation. Thus, a properly designed nanofiber-based plasma reactor will operate in a stable corona, glow or abnormal glow discharge regimes.

Figure 4:
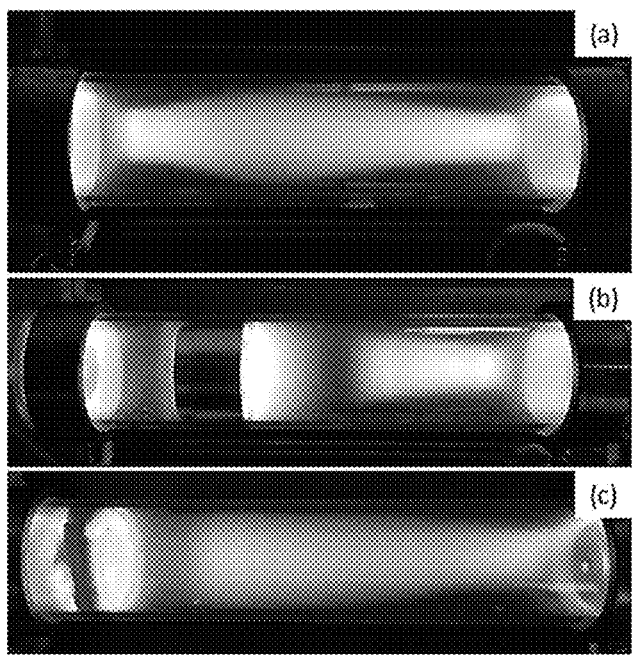
FIG. 4 are images illustrating examples of plasma appearance during experiments, in accordance with various embodiments of the present disclosure.

Examples of experimental results are illustrated in the images of FIG. 4. The plasma appearance depends on, e.g., the flow rate, pressure, voltage, and the electrode spacing of the 3D catalytic structure. The top image (a) of FIG. 4 shows operation without a nanofibrous catalytic membrane (NFCM) element. When immersed in a gas discharge plasma, the NFCM design and plasma parameters showed strong impact on plasma appearance, species present, and products obtained. Depending on the design and position of the NFCM element, the plasma appearance can change drastically as shown in the middle image (b) and bottom image (c) of FIG. 4. For example, the plasma brightness increases at the location of NFCM element, which indicates a strong effect of a catalyst on plasma species (Images (b) and (c) of FIG. 4).

Figure 5A:
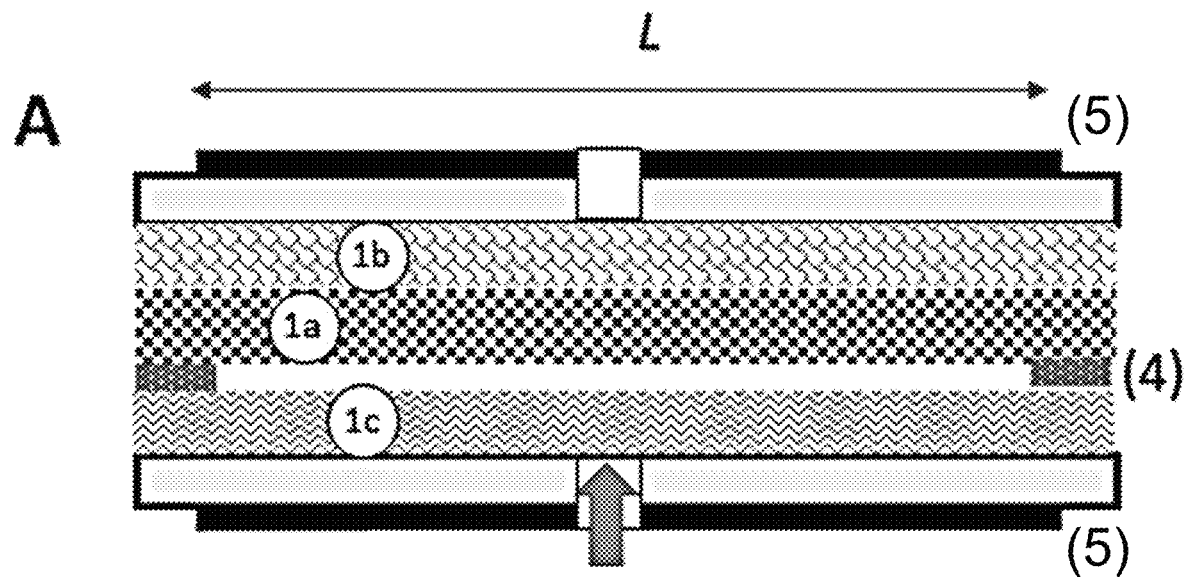
FIGS. 5A-5G illustrate examples of three-dimensional (3D) nanofiber-based catalytic structures, in accordance with various embodiments of the present disclosure.
Figure 5B:
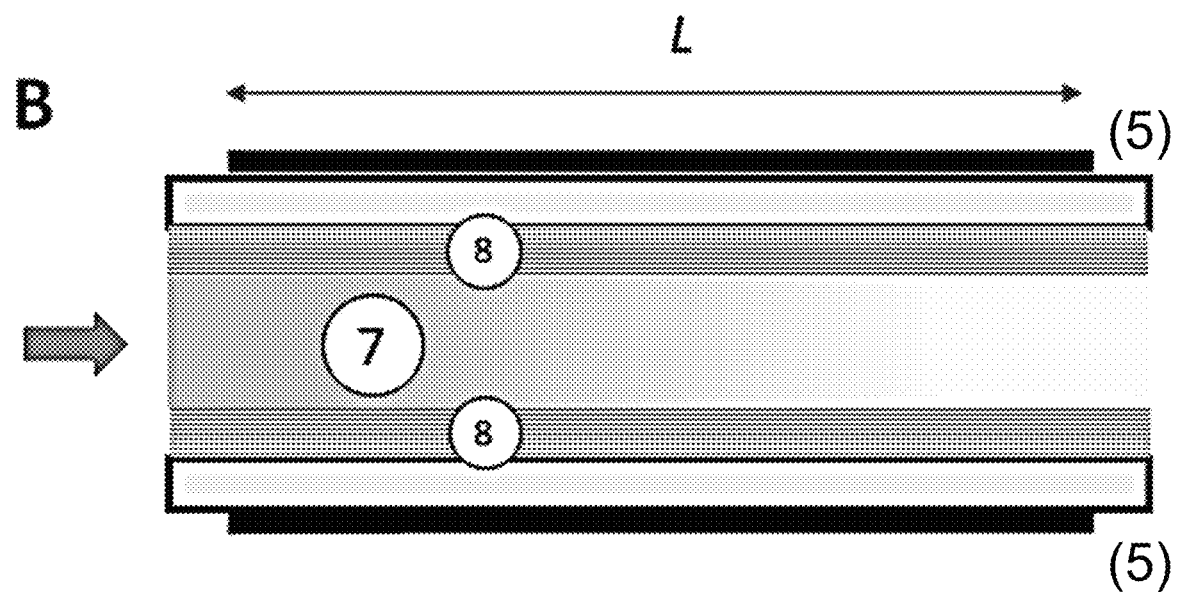

Referring to FIGS. 5A-5G, shown are examples of three-dimensional (3D) nanofiber-based catalytic structures that can be used in plasma reactors. Flow direction through the 3D catalytic structure is illustrated by the arrows. FIGS. 5A and 5B illustrate flat reactor with gas or fluid delivery either through the electrode (5) or through a sidewall of a vessel containing the 3D catalytic structure, with the electrodes extending across a length (L) of the 3D catalytic structure. In some implementations, each of the NFBEs can have different characteristics. In FIG. 5A, the 3D catalytic structure comprises NFBEs (1a, 1b and 1c) and a spacer (4) providing a gap between NFBEs 1b and 1c. The gap provides an empty space, not filled with nanofibrous material, for the reaction products to move from one NFBE to another, or for the plasma treatment without a NFBE. In FIG. 5B, the 3D catalytic structure comprises a gradient NFBE (7) having a gradient structure, composition or property that varies through the thickness of the NFBE, with the gradient NFBE (7) positioned between two NFBEs having aligned fibers (8). As shown, the flow direction passes along the length of the vessel and through the NFBEs.

Figure 5C:
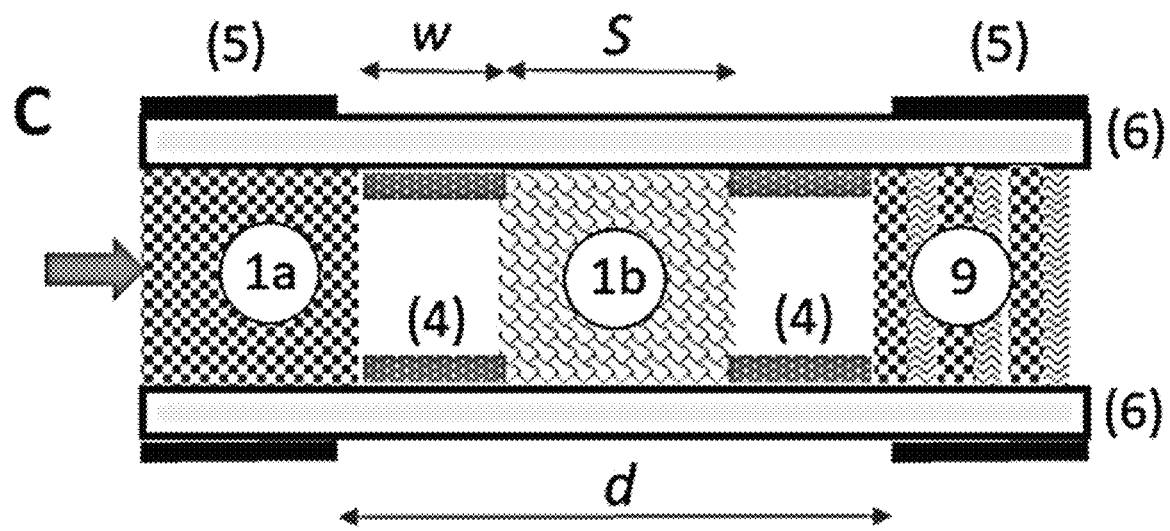
Figure 5D:
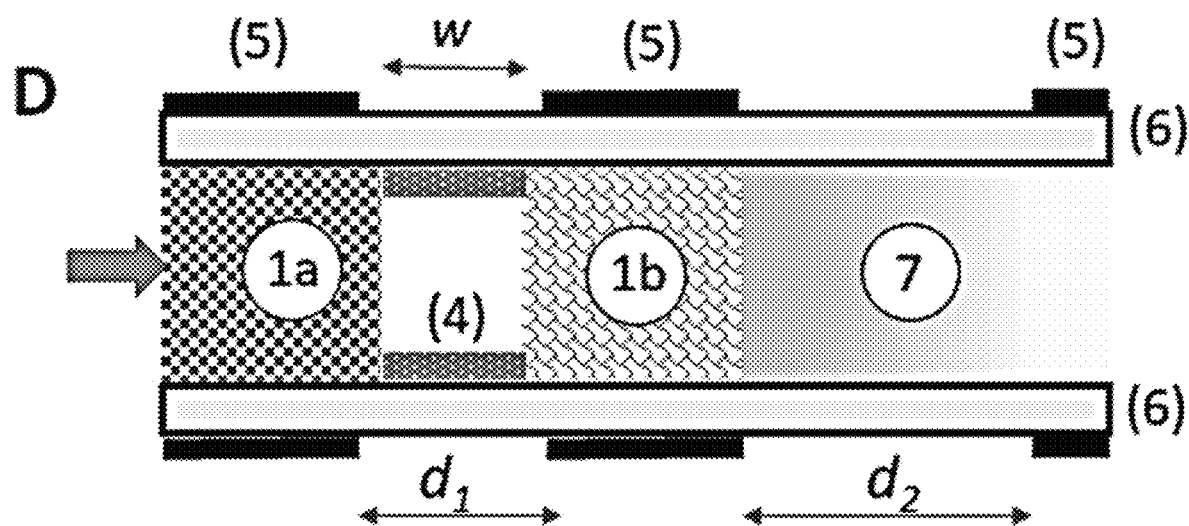

FIGS. 5C and 5D illustrate examples of tubular Double Dielectric Barrier Electric Discharge (DDBED) reactors with two outer electrodes (5) or three outer electrodes (5). The dielectric layer between one of the electrodes and NFBE can be removed to form a Single Dielectric Barrier Electric Discharge (SDBED) reactor structure. In FIG. 5C, the 3D catalytic structure includes a multilayer NFBE (9) and two single layer NFBEs (1a and 1b) with gaps provided by spacers (4) between the NFBEs. The width (w) of the gap can be less than or equal to the thickness (S) of the NFBEs. The distance (d) between the electrodes can be adjusted. In FIG. 5D, the 3D catalytic structure comprises two single layer NFBEs (1a and 1b) with a gap provided by spacer (4) between them, and a gradient NFBE (7) as part of the stack. The electrodes (5) can be isolated from the NFBEs by, e.g., the vessel (6). The distance (d1 and d2) can vary between the electrodes (5).

Figure 5E:
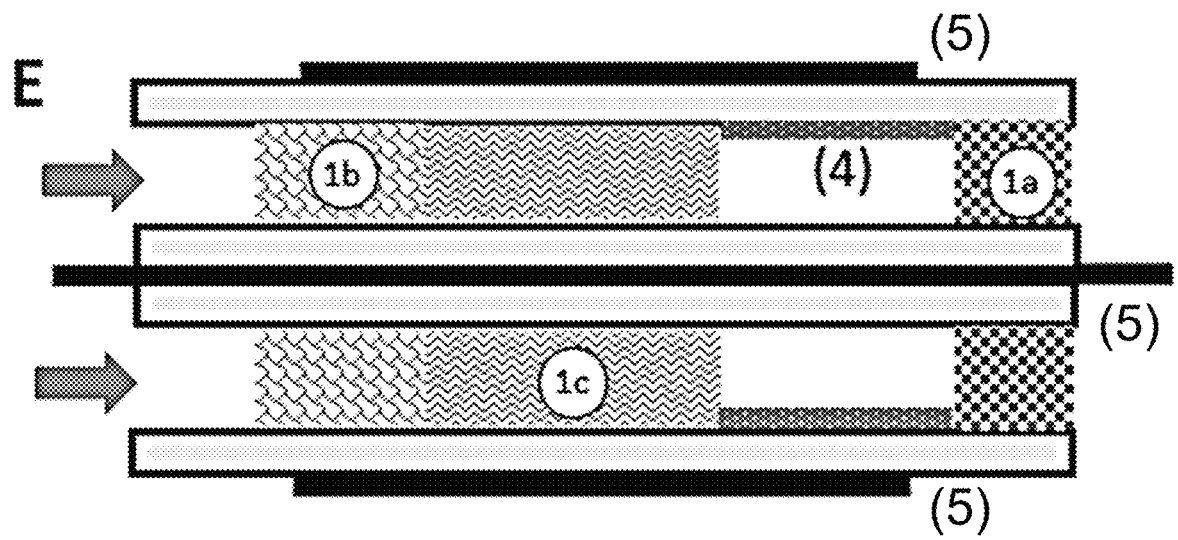
Figure 5F:
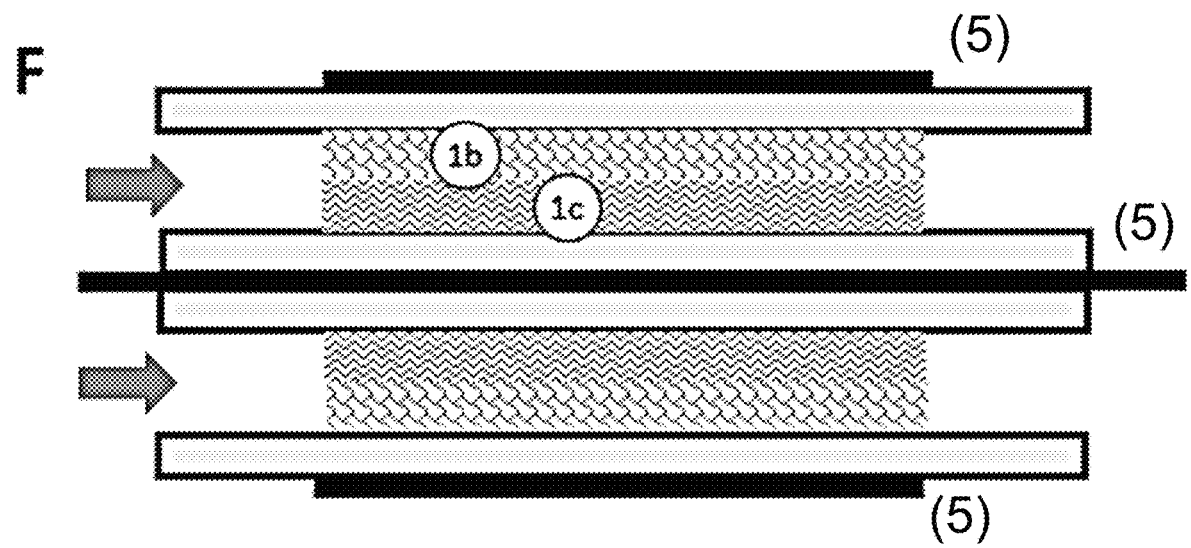

FIGS. 5E and 5F illustrate examples of tubular DDBED reactors with inner and outer electrodes (5). In FIG. 5E, the 3D catalytic structure is differentially assembled with NFBEs (1b, 1c and 1a) stacked sequentially with a gap provided by spacer (4) between NFBEs (1c and 1a). In FIG. 5F, the 3D catalytic structure is assembled with the NFBEs (1b and 1c) stacked in parallel about the inner electrode. Other stacking combinations are possible as can be appreciated.

Figure 5G:
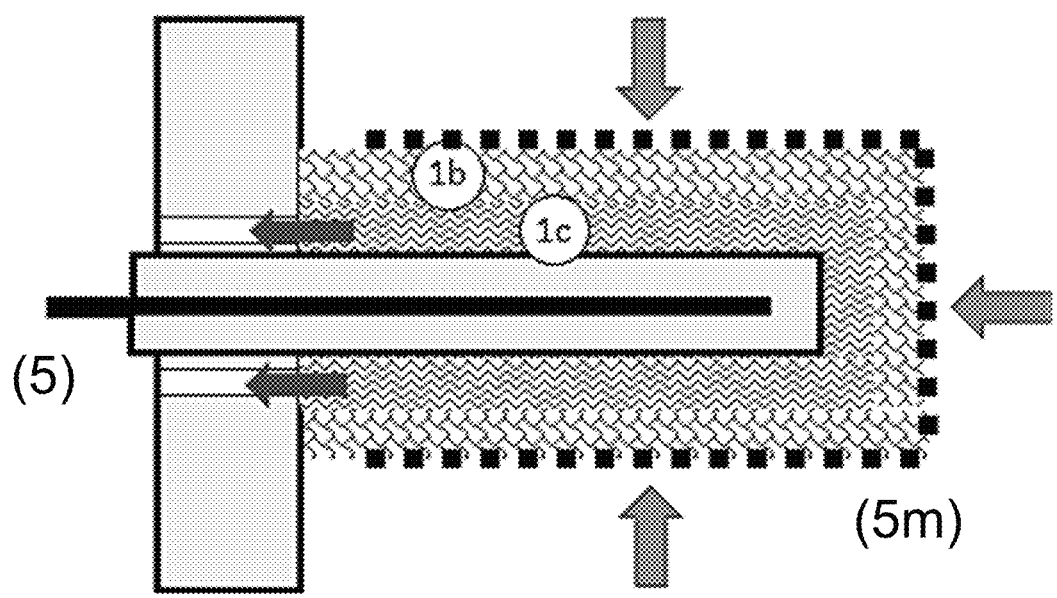

FIG. 5G illustrates an example of a hybrid SDBED reactor with inner electrode (5) and outer mesh electrode (5m). The hybrid SDBED reactor combines tubular and flat reactor design components, where the electrically insulated electrode (5) passes through the chamber wall and the mesh electrode (5m) is in direct contact with the NFBE. The 3D catalytic structure is assembled with layered NFBEs (1c and 1b) surrounding the inner electrode (5) inside the outer mesh electrode (5m). The nanofiber layers (NFBEs) have varying compositions, thickness, spacing, porosity, shape, and/or fiber diameters. As shown in FIG. 5G, the working gas or fluid can be delivered to an insulated chamber enclosing the reactor and can pass through the outer mesh electrode (5m) to the dielectric nanofiber layer 1b and nanofiber catalyst layer 1c (or one or more such layers). Ather the reaction, the product can be removed through chamber outlets as shown on the left.

The 3D catalytic structure can comprise nanofiber-based elements (NFBEs) placed between two or more electrodes. The electrodes can be bare or isolated, and can be located inside or outside a vessel containing the NFBEs. The NFBEs can comprise ceramic nanofibers, carbon nanofibers, metal nanofibers, or a combination of different nanofibers. For example, metal oxides, nitrides, carbides in different combinations (ceramics), oxides or carbon nanofibers coated with a continuous or particle metal layer, or containing metal particles inside the fibers, can be used. Polymer nanofibers are avoided to prevent the NFBE degradation in plasma and generation of unwanted plasma species. Characteristics of the NFBEs can be the same or different. For example, fiber diameter (e.g., less than 1000 nm), surface morphology (smooth or rough), porosity (related to nanofibrous element itself, e.g., total porosity above 75%), pore size (may contain micro or mesopores), material microstructure (e.g., amorphous, polycrystalline or single crystalline), phase (may contain amorphous or crystalline phase or their combination) and chemical composition, physical and chemical properties of the NFBE can be selected to achieve a desired result. One or more of the NFBEs can include variations (or gradients) in its fiber diameter, surface morphology, porosity, pore size, material microstructure, phase and chemical composition, physical and chemical properties through the thickness of the NFBE. For example, a NFBE can be composed of α-Alumina (α-$Al_2O_3$, catalyst support) coated with NiO nanoparticles (catalyst), whereas another NFBE can be composed of amorphous carbon nanofibers with Cu nanoparticles dispersed inside the fibers. Another example, a single NFBE is assembled of several layers of nanofibers with different composition, such as alumina-titania-alumina-silica. Each nanofibrous layer that forms a multilayer structure of NFBE can range from a single layer of nanofibers (so its thickness is comparable with nanofiber diameter) or can be several mm thick. The design and composition of each NFBE is determined by its function in enhancing or initiation a catalytic reaction that leads to a specific product or suppresses the production of undesired product.

One or more NFBE can comprise a multilayer structure or can have a gradient structure that varies over the thickness of the NFBE. For example, fiber diameter, surface morphology, porosity, pore size, material microstructure, phase and chemical composition, physical and chemical properties of the NFBE can vary (e.g., linearly or exponentially) across the thickness of the NFBE. The NFBEs can be separated from an adjacent NFBE or an adjacent electrode by a gap. The gap spacing can be provided by a spacer such as, e.g., a solid glass spacer, a ceramic spacer or a rigid spacer composed of the same nanofibers that form at least one of NFBEs separated by such spacer. The spacer can have a hollow cylindrical (tubular) shape of minimal wall thickness to support NFBEs. The length of the spacer determines the gap between the NFBEs. In a DBD operation mode, the spacing between the NFBE and the adjacent electrode is provided by a wall (e.g., glass or quartz) of the vessel containing the NFBE. The thickness of individual NFBEs can be about 0.1 mm or greater. The NFBE thickness and spacer length, as well as their location, are correlated with the width of bright and dark regions in plasma (Images (b) and (c) of FIG. 4, in part, with the width and number of plasma striations—periodic bright and dark plasma structures (those can be seen in two right upper photos in FIG. 3). The maximum MFBE thickness can be equal to or less than the distance between the two nearest electrodes (see, e.g., S vs. d in FIG. 5C). The total porosity of the materials in the 3D catalytic structure can be about 75%, about 80%, about 85% or greater.

In some embodiments, one or more NFBE can comprise aligned nanofibers within the NFBE to provide the predominant gas or fluid transport along the fibers. The nanofiber alignment can be provided within a defined range of misalignment angles to change the gas or fluid permeability of NFBE along the nanofibers in comparison with permeability across the nanofibrous layer where the nanofibers are packed perpendicular to the gas or fluid flow. The nanofibers of the NFBEs can be seeded with a co-catalyst. The co-catalyst can be seeded on the nanofibers in a continuous layer or as particles. Typical catalysts include, e.g., metal (Ni, Cu, Ru, Pt, Fe, Au, Ag) or oxide (e.g., redox-active oxides of Fe, Mo, W, V, Ni, Cu, Ce, Ti, Mn) particles with particle sizes less than 50 nm.

The 3D catalytic structure can be placed within a vessel of a plasma reactor, allowing the plasma reactor to operate with a gas pressure below one atmosphere within the vessel. The electrodes can have a devised size (e.g., length/width) and can be located outside the vessel, inside the vessel or a combination of both (see, e.g., FIGS. 5E and 5F). The electrodes can be excited with a DC voltage or with a periodic high voltage where the periodic comprises either pulses, or sinusoidal, or meander waveforms with the frequency below 150 kHz. Spacing between the electrodes can vary between about 5 mm to about 300 mm. The lower limit of the interelectrode spacing is determined by the voltage needed for the reactor operation while preventing the pressure/gas dependent parasitic arcing. The higher limit is also determined by the voltage needed to support the reactor operation within the preferred range of pressures (1-750 Torr). The Paschen's Law (in its simple form, plasma discharge voltage depends on and is the function of the multiple of interelectrode distance, d (in cm) and pressure, p (in Torr), or d×p parameter) which can be used to select the interelectrode distance for individual reactor, gases used, pressure, and NFBE configurations. In most cases, the Paschen's d×p parameter for the minimum breakdown voltage is in the range of about 1-100 Torr·cm. For example, for the minimum voltage for Ar plasma at d×p=1 and the interelectrode distance d=1 cm, this means 1 Torr operational pressure.

During operation, the plasma reactor can be maintained at a pressure less than 1 atmosphere. A gas or fluid can be supplied directly to one or more NFBE within the 3D catalytic structure through the designated gas/fluid feedthroughs in the reactor walls. In a case of fluid, one or more NFBEs serve as the wicks, which control the evaporating fluid species transport at reduced pressures. The reactor can be operated at a flow rate, pressure, voltage, and d×p (spacing×pressure) parameter that provide stable plasma without streamers formation. Typical parameters include, e.g., about 1-750 Torr pressure, about 0.2-10 kV voltage, and d×p=about 0.5-1000. The flow rate strongly depends on the NFBE configuration used.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A three-dimensional (3D) catalytic structure, comprising:
   a plurality of nanofiber-based elements (NFBEs); and
   a plurality of electrodes placed about the plurality of NFBEs, the plurality of NFBEs stacked between the plurality of electrodes.

2. The 3D catalytic structure of claim 1, wherein the plurality of NFBEs comprise ceramic nanofibers, carbon nanofibers, metal nanofibers, or a combination there of.

3. The 3D catalytic structure of claim 1, wherein the plurality of electrodes are bare or isolated.

4. The 3D catalytic structure of claim 3, wherein the plurality of electrodes comprises a mesh electrode.

5. The 3D catalytic structure of claim 1, wherein one or more NFBE of the plurality of NFBEs comprise a multilayer structure.

6. The 3D catalytic structure of claim 1, wherein one or more NFBE of the plurality of NFBEs comprise a gradient structure.

7. The 3D catalytic structure of claim 1, wherein one or more pairs of adjacent NFBEs of the plurality of NFBEs are separated by a gap.

8. The 3D catalytic structure of claim 7, wherein the gap between the adjacent NFBEs is formed by a spacer.

9. The 3D catalytic structure of claim 8, wherein the spacer comprises a solid glass spacer, a ceramic spacer, or a rigid NFBE-based spacer.

10. The 3D catalytic structure of claim 1, wherein a gap between an electrode of the plurality of electrodes and an adjacent NFBE of the plurality of NFBEs is formed by a spacer.

11. The 3D catalytic structure of claim 1, wherein individual NFBEs of the plurality of NFBEs have a thickness of about 0.1 mm or greater.

12. The 3D catalytic structure of claim 1, wherein total porosity of the plurality of NFBEs is about 75% or greater.

13. The 3D catalytic structure of claim 12, wherein the total porosity of the plurality of NFBEs is about 80% or greater.

14. The 3D catalytic structure of claim 1, wherein nanofibers of one or more of the plurality NFBEs are seeded with a co-catalyst.

15. The 3D catalytic structure of claim 14, wherein the co-catalyst is seeded on the nanofibers in a continuous layer or particles.

16. A plasma reactor, comprising:
    a vessel containing a three-dimensional (3D) catalytic structure comprising:
      a plurality of nanofiber-based elements (NFBEs); and
      a plurality of electrodes placed about the plurality of NFBEs, the plurality of NFBEs stacked between the plurality of electrodes;
    where gas pressure in the vessel is less than 1 atmosphere.

17. The plasma reactor of claim 16, wherein the plurality of electrodes are inside the vessel or outside the vessel.

18. The plasma reactor of claim 17, wherein a DC voltage or a periodic high voltage is applied to the plurality of electrodes.

19. The plasma reactor of claim 17, wherein spacing between adjacent electrodes of the plurality of electrodes is between about 5 mm to about 200 mm.

20. The plasma reactor of claim 16, wherein a gas or a fluid is supplied to one or more NFBE within the 3D catalytic structure.

* * * * *